(12) United States Patent
Mohta et al.

(10) Patent No.: US 12,306,287 B2
(45) Date of Patent: May 20, 2025

(54) FREQUENCY-SELECTIVE COMPENSATION IN RANGING RECEIVERS UTILIZING CHIRPED WAVEFORMS

(71) Applicant: AyDeeKay LLC, Aliso Viejo, CA (US)

(72) Inventors: Setu Mohta, Aliso Viejo, CA (US); Scott David Kee, Aliso Viejo, CA (US); Aravind Loke, Aliso Viejo, CA (US)

(73) Assignee: AyDeekay LLC, Aliso Viejo, CA (US)

( * ) Notice: Subject to any disclaimer, the term of this patent is extended or adjusted under 35 U.S.C. 154(b) by 394 days.

(21) Appl. No.: 17/556,362

(22) Filed: Dec. 20, 2021

(65) Prior Publication Data

US 2022/0260700 A1 Aug. 18, 2022

Related U.S. Application Data

(60) Provisional application No. 63/149,560, filed on Feb. 15, 2021.

(51) Int. Cl.
| | |
|---|---|
| *G01S 13/34* | (2006.01) |
| *G01S 7/4913* | (2020.01) |
| *G01S 13/42* | (2006.01) |
| *G01S 17/34* | (2020.01) |
| *G01S 17/42* | (2006.01) |

(Continued)

(52) U.S. Cl.
CPC ............ *G01S 13/34* (2013.01); *G01S 7/4913* (2013.01); *G01S 13/42* (2013.01); *G01S 17/34* (2020.01); *G01S 17/42* (2013.01); *G01S 17/93* (2013.01); *H03H 11/126* (2013.01)

(58) Field of Classification Search
None
See application file for complete search history.

(56) References Cited

U.S. PATENT DOCUMENTS

| | | | |
|---|---|---|---|
| 5,677,695 | A | 10/1997 | Suzuki et al. |
| 5,856,801 | A | 1/1999 | Valentine et al. |

(Continued)

OTHER PUBLICATIONS

PCT Patent Appl. Serial No. PCT/US21/64750, International Search Report and Written Opinion, Mar. 8, 2022.

*Primary Examiner* — Whitney Moore
(74) *Attorney, Agent, or Firm* — Steven Stupp

(57) ABSTRACT

An integrated circuit that includes an analog frequency-selective gain filter having a frequency-selective gain corresponding to a high-pass filter prior to an analog-to-digital converter (ADC) is described. During operation, the analog frequency-selective gain filter may provide frequency-selective gain (such as a high-pass filter characteristic) to an electrical signal corresponding to a received signal (such as a LiDAR signal, a sonar signal, an ultrasound signal and/or a radar signal) in a ranging receiver. Note that the received signal may correspond to a received frequency-modulated continuous-wave (FMCW) signal. Moreover, the integrated circuit may include a digital processing circuit after the ADC and control logic that instructs the digital processing circuit to characterize the frequency-selective gain (such as an amplitude and/or a phase at a frequency) during a calibration mode. Furthermore, the digital processing circuit may correct an output signal from the ADC based at least in part on the characterized frequency-selective gain.

20 Claims, 6 Drawing Sheets

(51) Int. Cl.
*G01S 17/93* (2020.01)
*H03H 11/12* (2006.01)

(56) References Cited

U.S. PATENT DOCUMENTS

| | | |
|---|---|---|
| 9,735,885 B1 | 8/2017 | Sayyah et al. |
| 10,418,944 B2 | 9/2019 | Kim et al. |
| 2009/0221256 A1 | 9/2009 | Sahinoglu et al. |
| 2009/0243913 A1 | 10/2009 | Sekiguchi et al. |
| 2016/0266239 A1 | 9/2016 | Pavao-Moreira et al. |
| 2018/0115371 A1 | 4/2018 | Trotta et al. |
| 2018/0183471 A1 | 6/2018 | Lin |
| 2019/0253030 A1 | 8/2019 | Eken |
| 2020/0072941 A1 | 3/2020 | Jansen et al. |
| 2021/0165088 A1* | 6/2021 | Suzuki .................. G01S 13/343 |
| 2021/0173069 A1* | 6/2021 | Wu ......................... G01S 7/352 |

\* cited by examiner

FREQUENCY-SELECTIVE COMPENSATION IN RANGING RECEIVERS UTILIZING CHIRPED WAVEFORMS

CROSS REFERENCE TO RELATED APPLICATIONS

This application claims priority under 35 U.S.C. 119(e) to U.S. Provisional Application Ser. No. 63/149,560, entitled "Frequency-Selective Compensation in Ranging Receivers Utilizing Chirped Waveforms," by Setu Mohta et al., filed on Feb. 15, 2021, the contents of both of which are herein incorporated by reference.

FIELD

The present disclosure relates to circuit techniques for use in a ranging receiver with broadband signals. Notably, in these circuit techniques an analog frequency-selective gain filter having a frequency-selective gain is included in the ranging circuit prior to an analog-to-digital converter (ADC).

BACKGROUND

Frequency-modulated waveforms called chirps are often used in active ranging systems, such as sonar, radar, and LiDAR. For example, a linearly frequency-modulated chirp may be transmitted by a frequency-modulated continuous-wave (FMCW) ranging system in a particular direction, where it is subsequently reflected by an object. The received chirp may be mixed with the transmitted chirp to produce a narrow beat tone whose frequency encodes the range to the object, and whose amplitude can be used to further infer additional path loss and target reflectivity. Notably, because it takes an electromagnetic signal longer to propagate over a larger distance, the resulting beat frequency increases proportionally with distance. Moreover, because of propagation loss, in general a signal from a larger distance has a smaller amplitude.

However, the measurement of the beat frequency tone often requires high-performance spectral estimation using a high-resolution ADC followed by a long-length Fourier transform (e.g., a Fast Fourier Transform or FFT and, more generally, a discrete Fourier Transform or DFT). Such an ADC typically requires a very high spurious-free dynamic range (SFDR) or, equivalently, a very high effective number of bits in order for the system to achieve a high maximum range. At the same time, the sampling frequency of the ADC usually is a bottleneck for the achievable range resolution. Consequently, it is typically difficult for an ADC to simultaneously provide high resolution and a high sampling rate within a reasonable power constraint (based on a cost-effective heat-sink and/or a desired battery life of an end application) and given semiconductor-technology limitations (including, but not limited to, matching and parasitics).

SUMMARY

Embodiments of an integrated circuit are described. This integrated circuit includes an analog frequency-selective gain filter having a frequency-selective gain corresponding to a high-pass filter prior to an ADC.

In some embodiments, the integrated circuit is included in a ranging receiver.

Moreover, the analog frequency-selective gain filter may provide frequency-selective gain to an electrical signal corresponding to a received optical signal. For example, the received optical signal may be a LiDAR signal.

Furthermore, the analog frequency-selective gain filter may provide frequency-selective gain to an electrical signal corresponding to a received FMCW signal. Note that the analog frequency-selective gain filter may be integrated into a transimpedance amplifier or may be follow (or may be located or positioned after) the transimpedance amplifier.

Additionally, the analog frequency-selective gain filter may provide frequency-selective gain to an electrical signal corresponding to a received: sonar signal, ultrasound signal, and/or a radar signal.

In some embodiments, the integrated circuit may include: a digital processing circuit after the ADC; and control logic. Note that the control logic may instruct the digital processing circuit to characterize the frequency-selective gain during a calibration mode, and the digital processing circuit may correct an output signal from the ADC based at least in part on the characterized the frequency-selective gain. Moreover, the characterized the frequency-selective gain includes an amplitude and/or a phase at a frequency. Furthermore, during the calibration mode, the control logic may apply one of: a signal from a transmitter to an input of a ranging circuit that includes the analog frequency-selective gain filter; or an internal reference signal to the input of the ranging circuit.

Additionally, the integrated circuit may determine a range to an object and/or a reflectivity of the object after the output signal is corrected for the characterized the frequency-selective gain.

Note that the frequency-selective gain may include an amplitude and/or a phase.

In some embodiments, the integrated circuit may include control logic that dynamically adapts the frequency-selective gain to reduce or eliminate a blocking signal at a frequency. For example, the dynamically adapted frequency-selective gain may include a notch filter at the frequency or a corner frequency of the analog pre-filter that is larger than the frequency.

Moreover, the analog frequency-selective gain filter may be implemented using a set of filters that are electrically coupled with each other in series and/or in parallel.

Furthermore, one or more of an upper limit of the frequency-selective gain, a lower limit of the frequency-selective gain, and/or a slope of the frequency-selective gain may be programmable.

Another embodiment provides an electronic device, a ranging receiver or a system that includes the integrated circuit.

Another embodiment provides a method for providing frequency-selective gain to a received signal using the integrated circuit.

Another embodiment provides a second integrated circuit that receives a receive signal corresponding to a transmit signal and mixes the receive signal with a local oscillator signal to provide a frequency-selective gain corresponding to a high-pass filter prior to an ADC. Note that the frequency-selective gain may be provided by varying, as a function of time based at least in part on frequency of a chirp waveform in the transmit signal, the local oscillator signal amplitude and/or power.

Moreover, the second integrated circuit may include a transceiver that performs the mixing and that converts the receive signal to an electrical signal prior to the ADC.

Furthermore, the second integrated circuit may include an analog frequency-selective gain filter having a second frequency-selective gain corresponding to the high-pass filter after the mixing and prior to the ADC.

Additionally, one or more of an upper limit of the frequency-selective gain, a lower limit of the frequency-selective gain, and/or a slope of the frequency-selective gain may be programmable.

Another embodiment provides an electronic device, a ranging receiver or a system that includes the second integrated circuit.

Another embodiment provides a method for providing frequency-selective gain to a received signal using the second integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

Figure 1:
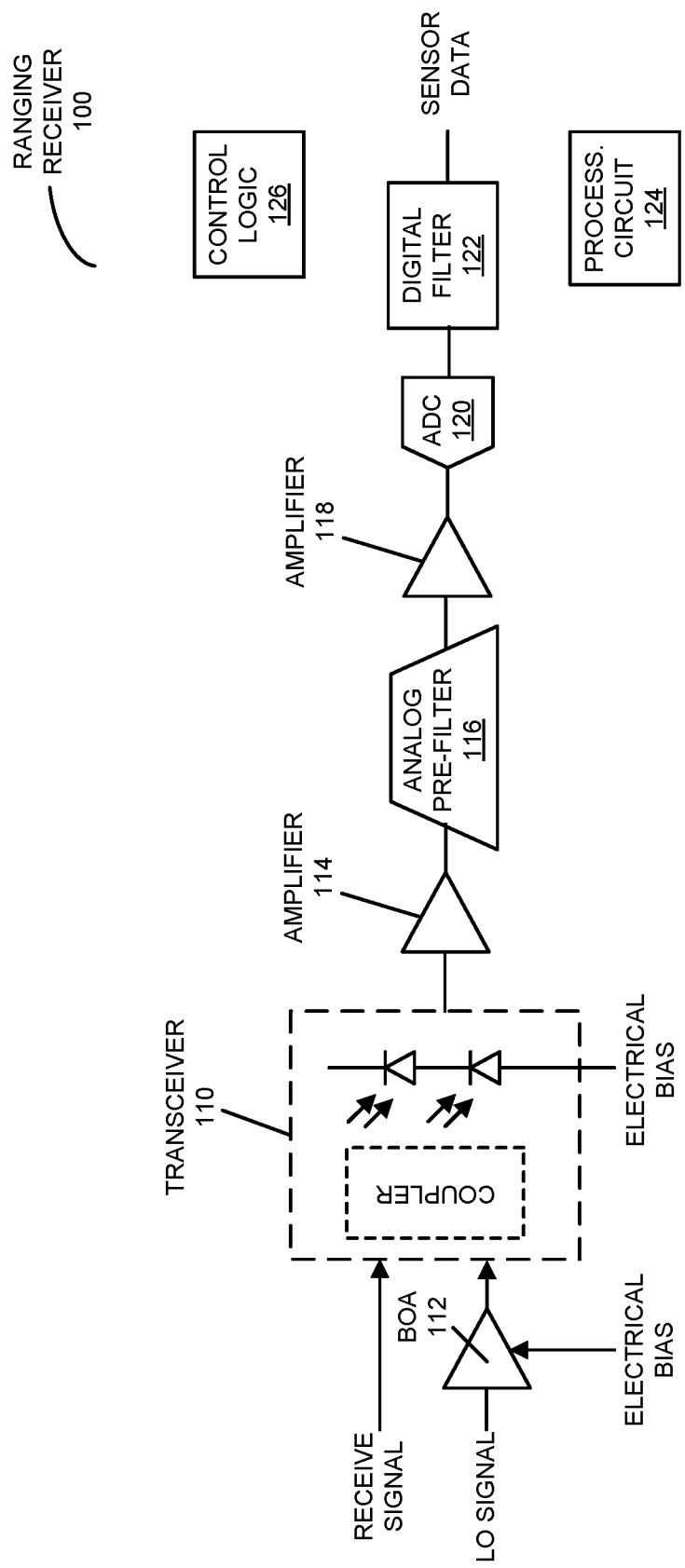
FIG. 1 is a block diagram illustrating an example of a ranging receiver according to some embodiments of the present disclosure.

An integrated circuit that includes an analog frequency-selective gain filter having a frequency-selective gain corresponding to a high-pass filter prior to an ADC is described. During operation, the analog frequency-selective gain filter may provide frequency-selective gain (such as a high-pass filter characteristic) to an electrical signal corresponding to a received signal (such as a LiDAR signal, a sonar signal, an ultrasound signal and/or a radar signal) in a ranging receiver. Note that the received signal may correspond to a received FMCW signal. Moreover, the integrated circuit may include a digital processing circuit after the ADC and control logic that instructs the digital processing circuit to characterize the frequency-selective gain (such as an amplitude and/or a phase at a frequency) during a calibration mode. Furthermore, the digital processing circuit may correct an output signal from the ADC based at least in part on the characterized frequency-selective gain. Additionally, the integrated circuit may determine a range to an object, its relative velocity and/or a reflectivity of the object after the output signal is corrected for the characterized frequency-selective gain. In some embodiments, the control logic dynamically adapts the frequency-selective gain to reduce or eliminate a blocking signal at a second frequency.

By providing the frequency-selective gain to the received signal, these circuit techniques may allow the ranging receiver to provide high resolution while using an ADC with lower dynamic range. This capability may allow the power consumption of the ranging receiver to be reduced, while making it easier to implement a given sampling rate. Therefore, the circuit techniques may enable improved performance, such as improved battery life, thermal management and/or meantime between failure (MTBF) of the overall system components. Consequently, the circuit techniques and/or the ranging receiver may be used in a wide variety of systems, electronic devices and applications.

We now describe embodiments of the circuit techniques. Notably, circuit techniques that reduce a dynamic range burden on an ADC in a ranging receiver without reducing the achievable maximum range and range resolution is described. In the circuit techniques, a high-pass filter (or, more generally, a filter having a frequency-selective gain) may be included in a ranging receiver prior to an ADC.

Note that reflected chirp signals originating from a more-distant object of a given reflectivity may have a smaller amplitude and a higher generated beat frequency. For example, the signal amplitude may be proportional to the inverse of the range to the object and the beat frequency may be proportional to the range. Thus, for ranges between 0.25 and 250 m, the signal power may vary by about 60 dB. In order to measure high-frequency small-amplitude signals, an ADC in a ranging receiver may need to have a high dynamic range and a high sampling rate. Notably, as an example, the input signal in the ranging receiver may vary from 100 μA at minimum range to 10 nA at maximum range. Without the disclosed analog pre-filter (and, more generally, the circuit techniques) described below, an ADC in a ranging receiver with a flat spectral response or gain may need to have a dynamic range in excess of 80 dB (up to an 18-bit ADC at 1-2 Gs/s to allow sufficient headroom and output signal-to-noise ratio to enable robust detection). However, it is very difficult to implement such an ADC.

In the circuit techniques, the dynamic range of the signal referred to the input of the ADC may be reduced by processing the received signal with a filter (which is sometimes referred to as an 'analog pre-filter') having a frequency-selective gain that emphasizes higher frequencies and attenuates lower-frequency signals. Notably, the analog pre-filter may perform frequency-selective equalization of the received signals by emphasizing high frequencies and reducing low frequencies.

In the discussion that follows, the circuit techniques are illustrated in a ranging receiver that receives an optical signal, such as a LiDAR signal. FIG. 1 presents a block diagram illustrating example of a ranging receiver 100 according to some embodiments of the present disclosure. This ranging receiver may include a transceiver 110 (such as a photodetector, e.g., coherent detection using balanced diodes) that performs optical-to-electrical conversion. Transceiver 110 may down convert an optical signal having a fundamental frequency in the TeraHertz or higher frequencies to baseband (e.g., with a bandwidth of 500 MHz). In some embodiments, the conversion process may involve mixing with the transmitted (or local oscillator or LO) signal via a buffered optical amplifier (BOA) 112. Moreover, transceiver 110 may include: an optional amplifier 114 (such as a low-noise amplifier that enables high signal-to-noise ratio to be achieved); an analog pre-filter 116; an optional amplifier 118 (with baseband gain to match the output signal with the dynamic range of ADC 120, so that utilization of ADC 120 may be increased or optimized); ADC 120; a digital filter 122 (e.g., digital signal processing or DSP) and/or an additional processing circuit 124 (which may perform range determination, reflectivity determination, DSP, etc.). Note that amplifier 118 may include an anti-aliasing filter (such as a low-pass filter based on the Nyquist frequency). Alternatively, in some embodiments, the anti-aliasing filter may be included between amplifier 118 and ADC 120.

Figure 2:
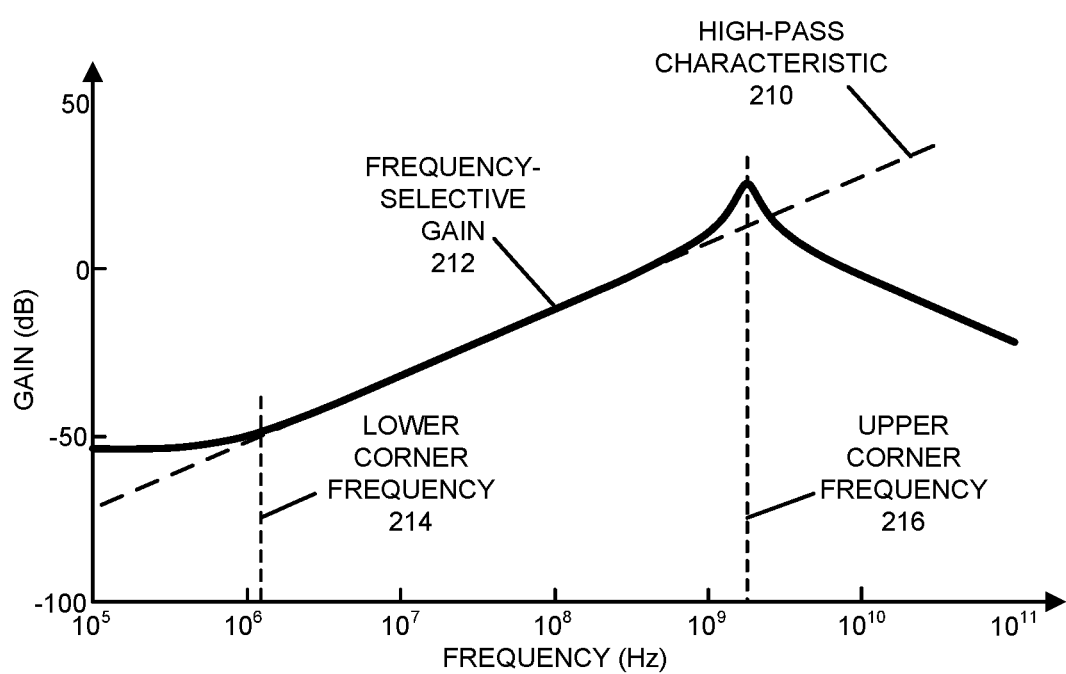
FIG. 2 presents a drawing illustrating an example of a frequency-selective gain of the analog pre-filter of FIG. 1 according to some embodiments of the present disclosure.

FIG. 2 presents a drawing illustrating an example of a frequency-selective gain 212 of analog pre-filter 116 according to some embodiments of the present disclosure. Ideally, analog pre-filter 116 may have a high-pass characteristic 210, shown by the dashed line in FIG. 2. In practice, analog pre-filter 116 may have frequency-selective gain 212 shown by the solid line in FIG. 2. Frequency-selective gain 212 may vary by 40-60 dB between 1 MHz and 500 MHz or 1 GHz. Moreover, analog pre-filter 116 may have a lower-corner frequency 214 and an upper-corner frequency 216 where frequency-selective gain 212 deviates from the ideal high-pass characteristic 210.

Figure 3:
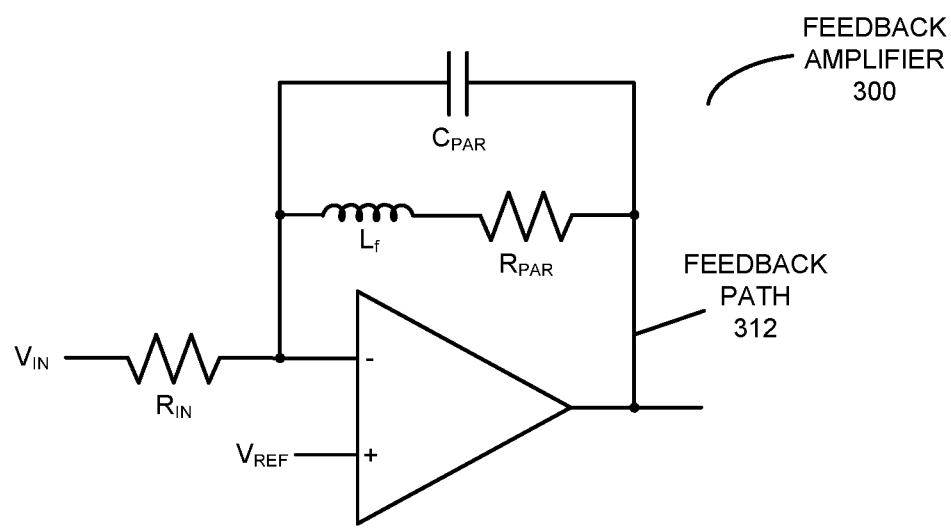
FIG. 3 presents a block diagram illustrating an example of a feedback amplifier according to some embodiments of the present disclosure.

In some embodiments, analog pre-filter 116 may be implemented using a feedback amplifier with a high-pass gain characteristic. For example, analog pre-filter 116 may be implemented using an operational amplifier or discrete transistors. FIG. 3 presents a block diagram illustrating an example of a feedback amplifier 300 according to some embodiments of the present disclosure. In FIG. 3, feedback amplifier 300 may include a low-pass filter in a feedback path 312 of feedback amplifier 300 in order to provide frequency-selective gain 212 (FIG. 2) in the forward path of feedback amplifier 300 that corresponds to a high-pass filter. Because analog pre-filter 116 (FIGS. 1 and 2) may have a broad bandwidth, self-resonance of a component in feedback path 312 (such as an inductor) may be a limiting factor. Consequently, as shown in FIG. 3, the combination of an inductor in feedback path 312 with parasitic resistance and capacitance may provide a low-pass filter.

Note that in order to improve the noise and power consumption of analog pre-filter 116 (FIG. 1), frequency-selective gain 212 (FIG. 2) may be implemented directly inside the transimpedance amplifier (amplifier 114 in FIG. 1). For example, the feedback network of the transimpedance amplifier can be modified to be frequency-selective instead of resistive, as is often the case.

In some embodiments, feedback amplifier 300 may have a gain of $10^6$, an input resistance $R_{IN}$ of 150Ω, a feedback inductance $L_f$ of 20 nH, a parasitic capacitance of $C_{PAR}$ of 1 fF, and a parasitic resistance of $R_{par}$ 0.3Ω. This feedback amplifier may provide approximately 62 dB of equalization over a band of frequencies corresponding to a range of approximately 240 m. Moreover, feedback amplifier 300 may provide 20 dB per frequency decade of frequency-selective gain 212 (FIG. 2). The signal-to-noise ratio of ranging receiver 100 (FIG. 1) may be approximately constant (within 3 dB) over a range of 1-240 m. Furthermore, the input current to transceiver 110 (FIG. 1) may vary from 2.56 μA at 1 m to 24.1 nA at 240 m or a change of 23.8 dB.

Referring back to FIG. 1, in some embodiments analog pre-filter 116 is implemented using a set of analog filters (such as filter bank) that are electrically coupled in series and/or in parallel. This approach may improve the dynamic range and/or the bandwidth of analog pre-filter 116.

In order to recover the true or actual received signal, ranging receiver 100 may need to perform calibration (e.g., in the digital domain) of frequency-selective gain 212 (FIG. 2) of analog pre-filter 116 or BOA 112 and associated bias in the LO path. This may allow the intentionally distorted signal provided by analog pre-filter 116 to be subsequently corrected in the digital domain based at least in part on one or more correction factors (such as the amount of gain provided by analog pre-filter 116 at a given frequency). For example, analog pre-filter 116 may increase the signal amplitude by +10 dB at 100 MHz. Consequently, in some embodiments, the digital correction may subsequently decrease the signal amplitude at 100 MHz by −10 dB. This may allow the reflectivity of an object to be accurately determined.

Figure 4:
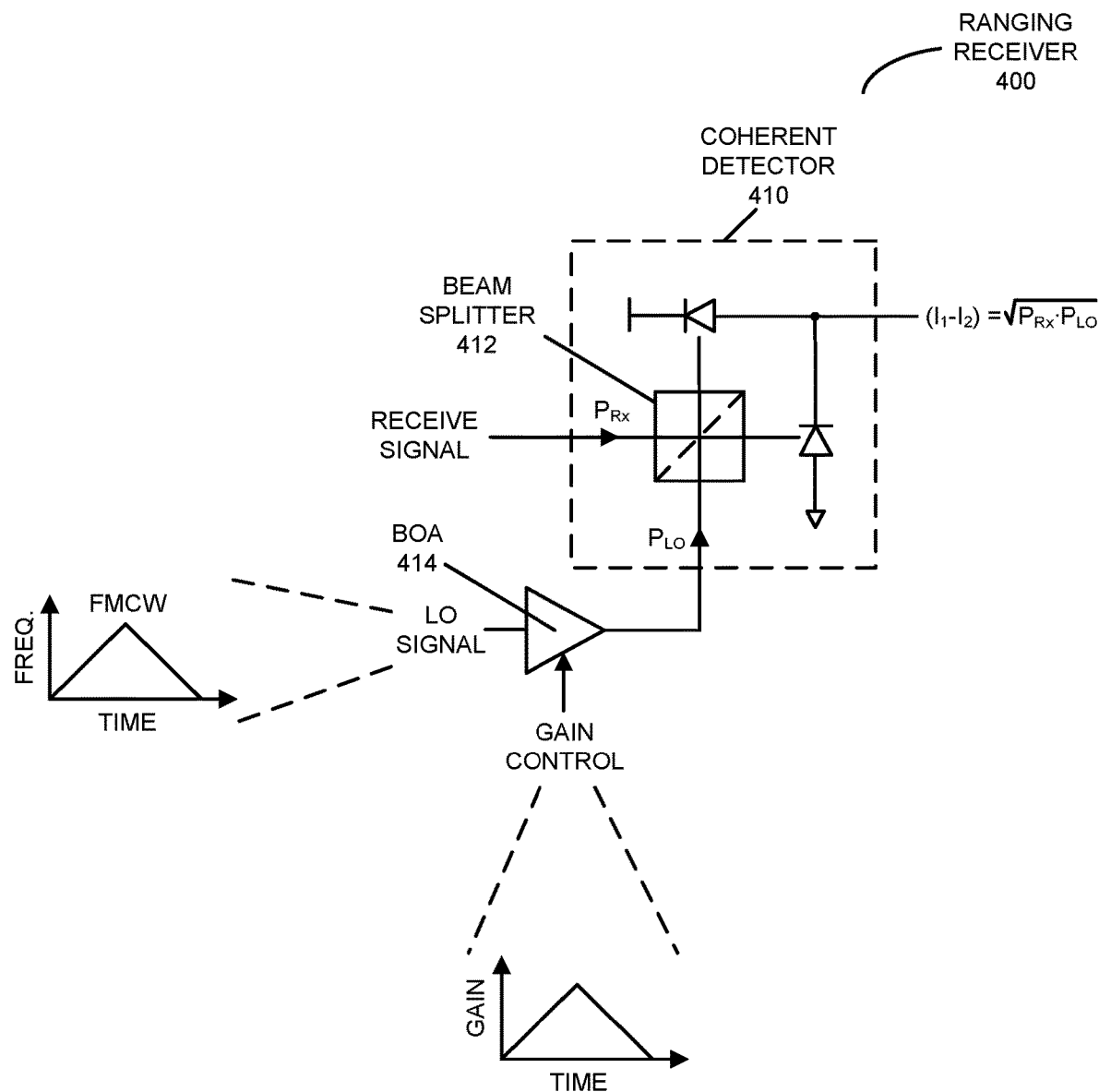
FIG. 4 is a block diagram illustrating an example of a portion of a ranging receiver according to some embodiments of the present disclosure.

Alternatively or additionally, as shown in FIG. 4, which presents a block diagram illustrating an example of a portion of a ranging receiver 400, in some embodiments frequency-selective gain 212 (FIG. 2) is provided by varying the optical LO power (or amplitude) as a function of time prior to the optical-to-electrical conversion by a coherent detector 410 (such as a beam splitter 412) in a transceiver. The LO power entering the transceiver can be ramped analogously to the frequency of the chirp waveform over the coherent processing interval by appropriately adjusting the electrical bias of BOA 414 in the LO path as a function of time. For example, if the transmit chirp is increasing in frequency, the electrical bias of BOA 414 is adjusted such that the LO power entering the transceiver also varies from a low to a high value. As the electrical output signal at the output of the transceiver entering amplifier 114 (FIG. 1) is proportional to the square root of the product of the receive signal and LO power, such a time-dependent modulation of the LO power intentionally provides a frequency-dependent gain for the resulting electrical signal. In this example, the high frequencies experience higher gain than lower frequency signals at the electrical output from the transceiver.

Figure 5:
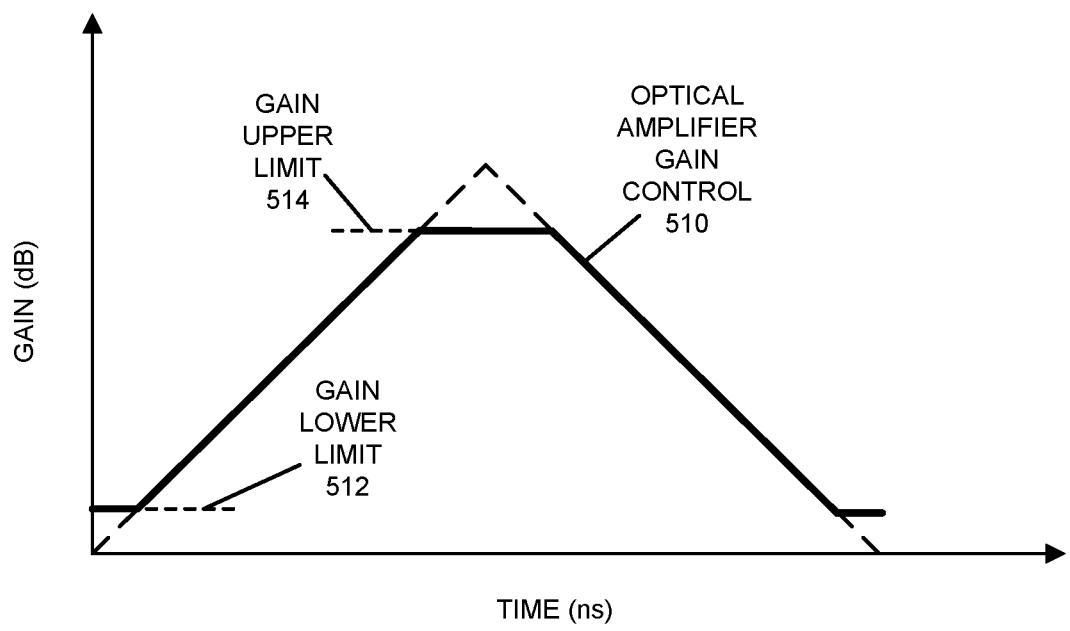
FIG. 5 presents a drawing illustrating an example of optical amplifier gain control of a frequency-selective gain of the ranging receiver of FIG. 4 according to some embodiments of the present disclosure.

In some embodiments, the upper limit of the frequency-selective gain (such as upper corner frequency 216 in FIG. 2), the lower limit of the frequency-selective gain (such as lower corner frequency 214 in FIG. 2), and/or slope of frequency-selective gain 212 (FIG. 2) can be programmed to optimize system performance. This is shown in FIG. 5, which presents an example of optical amplifier gain control 510 of a frequency-selective gain of ranging receiver 400 (FIG. 4). Notably, a lower non-zero limit for the gain or gain lower limit 512 of the optical amplifier (such as BOA 414 in FIG. 4) may be used to provide a non-zero LO power for coherent mixing with the received signal to occur successfully. Similarly, an upper limit for the gain or gain upper limit 514 may be used to prevent saturation and/or non-linearity in BOA 414 (FIG. 4) itself. Furthermore, BOA 414 (FIG. 4) and the electrical bias of BOA 414 (FIG. 4) in the receive path may be implemented using substantially the same or matching components as the electrical bias and BOA(s) used in the transmit path in order to improve matching of the coherent mixing process by matching the amplitude and phase characteristics of the resulting optical signals.

Notably, in the calibration, the gain and/or the phase characteristics of analog pre-filter 116 (FIG. 1), BOA 112 (FIG. 1), BOA 414 (FIG. 4) and/or the electrical bias of BOA 112 (FIG. 1) or BOA 414 (FIG. 4) may be measured during production or one or more (e.g., periodic) runtime calibration operations. Consequently, the calibration may capture the non-ideality of analog pre-filter 116 (FIG. 1), BOA 112 (FIG. 1), BOA 414 (FIG. 4) and/or the electrical bias of BOA 112 (FIG. 1) or BOA 414 (FIG. 4). Then, the gain and phase characteristics may be compensated in the digital domain (after ADC 120 in FIG. 1) in order to determine the actual received signal amplitude and/or phase. Note that the compensation may occur during or after the calibration. In some embodiments, the calibration involves a digital spectral estimation procedure.

For example, during the calibration, the gain and/or the phase characteristics of analog pre-filter 116 (FIG. 1) may be measured using an internal signal. This may allow the calibration to be dynamically repeated, as needed. In LiDAR systems, a reference channel that is used to measure laser nonlinearity and optical characteristics may be used during the calibration. Notably, the LiDAR system may include an optical source that is looped back to ranging receiver 100 (FIG. 1) or ranging receiver 400 (FIG. 4), so that an optical or laser signal is input to the transceiver without propagating through the atmosphere (and, based on measurements performed by a power detector, which may have a known power). Alternatively or additionally, an auxiliary sine-wave generator may provide a calibration signal to the ranging receiver during calibration.

After a calibration factor is measured during calibration, it may be stored in non-volatile memory in or associated with ranging receiver 100 (FIG. 1) or ranging receiver 400 (FIG. 4). For example, one or more calibration factors may be stored in a look-up table. In some embodiments, the one or more calibration factors may be at a set of predefined frequencies. Alternatively or additionally, in some embodiments, the one or more calibration factors may include a cubic spline or may correspond to a theoretical curve.

Moreover, as noted previously, during or after the calibration, the stored one or more calibration factors may be used to perform a de-emphasis operation. In some embodiments, ranging receiver 100 (FIG. 1) or ranging receiver 400 (FIG. 4) interpolates between at least some of the stored one or more calibration factors in order to determine a correction at a particular frequency.

In the circuit techniques, frequency-selective gain 212 (FIG. 2) of analog pre-filter 116 (FIG. 1), BOA 112 (FIG. 1), BOA 414 (FIG. 4) and/or the electrical bias of BOA 112 (FIG. 1) or BOA 114 (FIG. 4) may not be fixed. Instead, the frequency-selective gain may be adapted (e.g., periodically) to include dynamic notch filtering to null signals (which are sometimes referred to as 'blockers' in communication systems) from bright reflectors, which may be seen after a first round of digital spectral estimation. For example, control logic 126 (FIG. 1) may perform dynamic adaptation of frequency-selective gain 212 (FIG. 2) provided by one or more components in the ranging receiver. Note that filtering of the blocking signals associated with bright reflectors may improve the capability of the ranging receiver (or an electronic device or a system that includes the ranging receiver) to measure fainter sources at different ranges without ADC saturation (which may otherwise occur in the presence of the blocking signals). Note that blocking signals may arise from known reflections at close range in the signal path from the transmitter to the object. For example, blocking signals may be associated with the physical layout of the housing of the ranging receiver (or an electronic device or a system that includes the ranging receiver) and associated transmit windows (such as glass or dirt deposited or collected on a transmit window), or from highly reflective objects in the field of view (such as a vehicle bumper or a street sign) whose position, once cataloged, need to be removed from subsequent observations of the same field of view. In embodiments where a blocking signal occurs at a close range to the ranging receiver (such as a transmit window or a vehicle bumper), the blocking signal may be eliminated using a wideband bandpass filter (such as 500 MHz) that cuts out or eliminates frequencies below 1 MHz.

Note that the disclosed frequency-selective compensation in the circuit techniques may be different from automatic gain control or leveling control in communications receivers, where the quantity that is being controlled is the amplitude of the received signal, which is typically narrow-band. Similarly, the frequency-selective compensation in the circuit techniques may be different from a narrowband channel selective filter in a communications receiver. In contrast, in ranging receivers or ranging systems, the bandwidth of the received signal may be very wide. For example, the received signal may correspond to ranges between 0.1-1 m and 300 m. Consequently, concentrating on signal amplitude at one given frequency is typically not feasible.

In some embodiments, ADC 120 (FIG. 1) in the ranging receiver with analog pre-filter 116 (FIG. 1) may have less than 8 bits of resolution or a dynamic range of 48 dB with a sampling rate of 1-2 Gs/s. This is in contrast with a ranging receiver without analog pre-filter 116 (FIG. 1), which may have 18 bits of resolution or a dynamic range of 80 dB with a sampling rate of 1-2 Gs/s. Note that ADC 120 (FIG. 1) may include: a successive-approximation-register (SAR) ADC, another type of interleaved ADC, a pipeline ADC, a flash ADC, or another type of ADC.

In some embodiments, by reducing the SFDR and the effective number of bits (ENOB) requirement of ADC 120 (FIG. 1) in a ranging receiver, the disclosed analog pre-filter 116 (FIG. 1) may allow simpler ADC architectures to be used. For example, flash ADCs that are suitable for higher sampling rates and lower latency at a given power (but that can usually only achieve a smaller SFDR) may be used in high maximum-range ranging applications without compromising the maximum range or the range resolution. More generally, by reducing the dynamic range, data converters of a given sampling rate may be easier to implement, such as with reduced power consumption. These capabilities may improve the overall battery life and may reduce the heat-sinking burden of the ranging receiver.

Note that the circuit techniques may be implemented using discrete components or integrated components (such as in an integrated circuit). Thus, in some embodiments, some or all of the components in the ranging receiver may be implemented using one or more integrated circuits.

The circuit techniques may be used in a wide variety of ranging receivers for different types of received signals, including: optical (such as LiDAR), sonar, ultrasound and/or radar. Moreover, the circuit techniques may be used in a wide variety of applications, such as: automotive (e.g., partial or fully-automated vehicles), aircraft, satellite-based mapping (e.g., a geographic information system), physical sciences (e.g., a particle accelerator or a detector), medical (such as medical imaging), measurement equipment, communication (such as optical or wireless communication), data storage, etc. Consequently, the different types of received signals may occur in a variety of different bands of frequencies.

Figure 6:
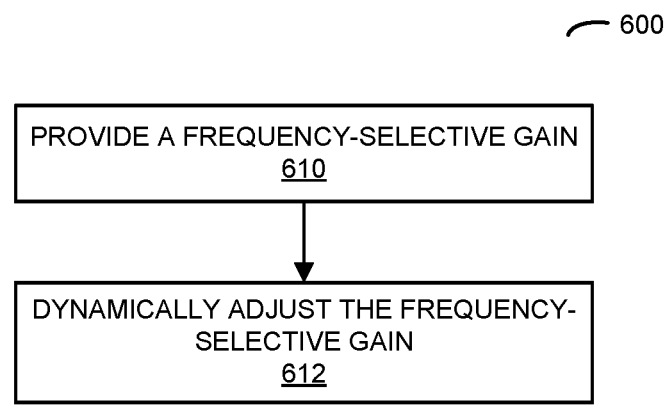
FIG. 6 is a flow diagram illustrating an example of a method for providing frequency-selective gain to a received signal according to some embodiments of the present disclosure.

We now describe embodiments of a method. FIG. 6 presents a flow diagram illustrating an example of a method 600 for providing frequency-selective gain to a received signal using an integrated circuit, such as integrated circuit that implements at least a portion of ranging receiver 100

(FIG. 1) or 400 (FIG. 4). During operation, the integrated circuit may provide, using an analog frequency-selective gain filter, a frequency-selective gain (operation 610) corresponding to a high-pass filter prior to an ADC. Moreover, the integrated circuit may dynamically adapt the frequency-selective gain (operation 612) to reduce or eliminate a blocking signal at a frequency.

In some embodiments of the method 600, there may be additional or fewer operations. Moreover, the order of the operations may be changed, and/or two or more operations may be combined into a single operation.

The disclosed circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the integrated circuit, in alternative embodiments different components and/or subsystems may be present in the integrated circuit and/or a ranging receiver. Thus, the embodiments of the integrated circuit and/or the ranging receiver may include fewer components, additional components, different components, two or more components may be combined into a single component, a single component may be separated into two or more components, one or more positions of one or more components may be changed, and/or there may be different types of components.

Moreover, the circuits and components in the embodiments of the integrated circuit and/or the ranging receiver may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
a filter, in a single receive path, having a frequency-selective gain corresponding to a high-pass filter prior to an analog-to-digital converter (ADC), wherein the filter is configured to dynamically adapt the frequency-selective gain to reduce or eliminate a blocking signal at a frequency; and
wherein the blocking signal is associated with a reflector in an environment.

2. The integrated circuit of claim 1, wherein the integrated circuit is included in a ranging receiver.

3. The integrated circuit of claim 1, wherein the filter is configured to provide frequency-selective gain to an electrical signal corresponding to a received optical signal.

4. The integrated circuit of claim 3, wherein the received optical signal is a LIDAR signal.

5. The integrated circuit of claim 1, wherein the filter is configured to provide frequency-selective gain to an electrical signal corresponding to a received frequency-modulated continuous-wave (FMCW) signal.

6. The integrated circuit of claim 5, wherein the filter is integrated into a transimpedance amplifier or is positioned after the transimpedance amplifier.

7. The integrated circuit of claim 1, wherein the filter is configured to provide frequency-selective gain to an electrical signal corresponding to a received: sonar signal, ultrasound signal, or a radar signal.

8. The integrated circuit of claim 1, wherein the integrated circuit comprises:
a digital processing circuit after the ADC; and
control logic, and wherein the control logic is configured to instruct the digital processing circuit to characterize the frequency-selective gain during a calibration mode and the digital processing circuit is configured to correct an output signal from the ADC based at least in part on the characterized the frequency-selective gain.

9. The integrated circuit of claim 8, wherein the characterized the frequency-selective gain comprises an amplitude and a phase at a frequency.

10. The integrated circuit of claim 8, wherein, during the calibration mode, the control logic is configured to apply one of: a signal from a transmitter to an input of a ranging circuit that comprises the analog frequency-selective gain filter; or an internal reference signal to the input of the ranging circuit.

11. The integrated circuit of claim 1, wherein the integrated circuit is configured to determine a range to an object, a reflectivity of the object or both after the output signal is corrected for the characterized the frequency-selective gain.

12. The integrated circuit of claim 1, wherein the frequency-selective gain comprises an amplitude and a phase.

13. The integrated circuit of claim 1, wherein the integrated circuit comprises control logic that is configured to dynamically adapt the frequency-selective gain to reduce or eliminate a blocking signal at a frequency.

14. The integrated circuit of claim 13, wherein the dynamically adapted frequency-selective gain comprises a notch filter at the frequency or a corner frequency of the analog pre-filter that is larger than the frequency.

15. The integrated circuit of claim 1, wherein the filter is implemented using a set of filters that are electrically coupled with each other in series, in parallel or both.

16. The integrated circuit of claim 1, wherein one or more of an upper limit of the frequency-selective gain, a lower limit of the frequency-selective gain, or a slope of the frequency-selective gain are programmable.

17. An electronic device, comprising:
an integrated circuit, wherein the integrated circuit comprises:
a filter, in a single receive path, having a frequency-selective gain corresponding to a high-pass filter prior to an analog-to-digital converter (ADC), wherein the filter is configured to dynamically adapt the frequency-selective gain to reduce or eliminate a blocking signal at a frequency; and
wherein the blocking signal is associated with a reflector in an environment.

18. The electronic device of claim 17, wherein the filter is configured to provide frequency-selective gain to an electrical signal corresponding to: a received: optical signal; a received sonar signal; a received ultrasound signal; or a received radar signal.

19. A method for providing frequency-selective gain to a received signal, comprising:
by an integrated circuit;
providing, using a filter in a single receive path, a frequency-selective gain corresponding to a high-pass filter prior to an analog-to-digital converter (ADC); and
dynamically adapting the frequency-selective gain of the filter to reduce or eliminate a blocking signal at a frequency, wherein the blocking signal is associated with a reflector in an environment.

20. The method of claim 19, wherein the filter is configured to provide frequency-selective gain to an electrical signal corresponding to: a received: optical signal; a received sonar signal; a received ultrasound signal; or a received radar signal.

* * * * *